United States Patent
Matsuoka

(10) Patent No.: US 7,006,371 B2
(45) Date of Patent: Feb. 28, 2006

(54) SEMICONDUCTOR MEMORY DEVICE AND METHOD FOR PROGRAMMING AND ERASING A MEMORY CELL

(75) Inventor: Nobuaki Matsuoka, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/722,732

(22) Filed: Nov. 25, 2003

(65) Prior Publication Data

US 2004/0114444 A1 Jun. 17, 2004

(30) Foreign Application Priority Data

| Dec. 4, 2002 | (JP) | ............................. 2002-353053 |
| Jan. 28, 2003 | (JP) | ............................. 2003-018645 |

(51) Int. Cl.
*G11C 11/00* (2006.01)

(52) U.S. Cl. ...................... 365/148; 365/218; 365/210

(58) Field of Classification Search .................. 365/46, 365/100, 104, 158, 148, 210, 189.04
See application file for complete search history.

(56) References Cited

U.S. PATENT DOCUMENTS

| 5,287,317 A | 2/1994 | Kobayashi et al. |
| 5,495,442 A | 2/1996 | Cernea et al. |
| 5,712,815 A | 1/1998 | Bill et al. |
| 5,867,427 A | 2/1999 | Sato |
| 6,473,332 B1 | 10/2002 | Ignatiev et al. |
| 2002/0159294 A1 | 10/2002 | Kato |
| 2004/0184331 A1 * | 9/2004 | Hanzawa et al. ........... 365/203 |

FOREIGN PATENT DOCUMENTS

| EP | 0 905 712 A1 | 3/1999 |
| JP | 5-182474 | 7/1993 |
| WO | WO-01/45108 A1 | 6/2001 |

OTHER PUBLICATIONS

European Search Report mailed Oct. 4, 2005 for European Patent Application No. 03257632.4, 2 pages.

* cited by examiner

*Primary Examiner*—Thong Q. Le
(74) *Attorney, Agent, or Firm*—Morrsion & Foerster LLP

(57) ABSTRACT

A semiconductor memory device comprises a memory array in which memory cells having variable resistive elements ($R_{11}$ to $R_{ij}$) whose electrical resistance is varied by electrical stress and is held even after the electrical stress is released and selection transistors ($T_{11}$ to $T_{ij}$) comprising N type MOSFETs are arranged with a matrix; programming means for applying the electrical stress to the variable resistive elements ($R_{11}$ to $R_{ij}$) to program data into the memory cell; programming state detection means for detecting the variation in the electrical resistance at the time of the programming operation; and programming control means for stopping the application of the electrical stress when the electrical resistance is varied to a predetermined reference value. With this structure, it is possible to constitute the semiconductor memory device in which the time required for programming data is shortened and the programming precision is high.

38 Claims, 15 Drawing Sheets

SEMICONDUCTOR MEMORY DEVICE AND METHOD FOR PROGRAMMING AND ERASING A MEMORY CELL

BACKGROUND OF THE INVENON

1. Field of the Invention

The present invention relates to a semiconductor memory device and a programming and erasing method of a memory cell, and more particularly, to a programming and erasing method which can effectively used for a nonvolatile semiconductor memory device using a variable resistive element.

2. Description of the Related Art

As an EEPROM which is a conventional electrically erasable and programmable read-only memory, a NAND cell type EEPROM which can increase the packing density is known. Japanese Unexamined Patent Publication No.H5-182474 describes as follows. In the NAND cell type EEPROM, a plurality of memory cells are connected to each other in series and connected to a bit line as one unit such that the plurality of memory cells use sources and drains of the adjacent memory cells. The memory cell is usually of an FETMOS structure in which a charge-storage layer and a control gate are laminated on each other. A memory cell array is packed in a positive type well (P type well) formed on a positive type substrate (P-type substrate) or a negative type substrate (N type substrate). A drain of the NAND cell is connected to a bit line through a selection gate, and a source side of the NAND cell is connected to a source line (reference potential line) through the selection gate. The control gate of the memory cell is continuously disposed in a line direction and becomes a word line.

The NAND cell type EEPROM operates as follows. The programming operation of data is carried out from a memory cell located furthest from the bit line in this order. High voltage Vpp (about 20V) is applied to a control gate of the selected memory cell, intermediate potential VppM (about 10V) is applied to a selection gate and a control gate of a memory cell located closer to the bit line than the former memory cell, and 0V or intermediate potential is applied to the bit line in accordance with data. When 0V is applied to the bit line, the potential is transmitted to the drain of the selected memory cell, and electron injection is generated in the floating gate from the substrate. With this, a threshold voltage of the selected memory cell is shifted in the normal direction. This state is defined as "1" for example. When intermediate potential is applied to the bit line, electron injection is not caused, the threshold voltage is not varied and stops in negative. This state is "0".

Data erasion is simultaneously carried out with respect to all the memory cells in the NAND cell. That is, all the control gates are set to 0V, high voltage of 20V is applied to the selection gate, the bit line, the source line, the P type well in which the memory cell array is formed, and the N type substrate. With this, electrons of the floating gates in all the memory cells are discharged toward the substrate side, and the threshold voltage is shifted in the negative direction.

Data reading operation is carried out in such a manner that voltage of the control gate of the selected memory cell is set to 0V, the control gates and selection gates of other memory cells is set to source potential Vcc (=5V), and it is detected whether current flows through the selected memory cell.

As apparent from the above explanation of the operation, in the NAND cell type EEPROM, the non-selected memory cells function as transfer gates at the time of programming and reading operation. In view of this point, constraints are added to threshold voltage of a programmed memory cell.

For example, a preferable range of the threshold voltage of a memory cell which is programmed with "1" is about 0.5 to 3.5V. If variation with time after data programming, variation in producing parameter of memory cell and variation of source potential are taken into consideration, it is required that distribution of threshold voltage after data programming is smaller than the preferable range.

However, in the case of the conventional method in which the programming potential and programming time are fixed, and all the memory cells are programmed with data under the same condition, it is difficult to contain the threshold voltage range after the programming of "1" in a tolerance. For example, characteristics of memory cell are varied due to variation of producing process thereof. Therefore, if the programming characteristics are considered, there are memory cells which can easily be programmed and memory cells which are difficult to be programmed. Conventionally, all the memory cells are programmed under the same condition with sufficient lead time to perform the programming so that the memory cell which is difficult to be programmed can sufficiently be programmed. With this method, however, the memory cell which is easily programmed is programmed more than necessary, and the threshold voltage exceeds the tolerance.

On the other hand, if threshold voltage of a memory cell programmed with "0" or of a NAND cell from which data is erased becomes greater by certain value in the negative direction, this is also a problem. In the threshold voltage of the memory cell programmed with "0", cell current (reading current) at the time when data is read is varied due to this problem and as a result, access time is varied. Thus, specification of the EEPROM is varied. If data is not erased by data erasion, threshold voltage in the state "1" is increased more than necessary due to subsequent data programming, and the threshold voltage exceeds its tolerance.

To solve these problems, the above publication proposes a NAND cell type EEPROM having a programming verify function. Here, this EEPROM has a programming verify control circuit including a function to apply first programming verify potential in succession to control gates of memory cells in the NAND cell which is selected at the time of data programming, and for reading data to confirm a programming shortage state, and a function for applying second programming verify potential to the control gate of the selected memory cell, and for reading data to confirm an excessively programmed state. With this, if there is a memory cell which is lacking in programming, the programming operation is added, and first data programming verify potential is applied to the memory cell to confirm the programmed state again. This operation is repeated, and after the first programming verify and data re-programming with respect to the memory cell are completed, the confirmation operation of the excessively programmed state using the second programming verify potential is carried out. By repeating such operation, a memory cell having required threshold voltage is controlled such that the memory cell is not programmed again, thereby solving the above problem.

U.S. Pat. No. 5,287,317 proposes a similar electrically erasable and programmable semiconductor memory. That is, in the case of data programming, as shown in FIG. 14, after a programming command is input (step S1) in the electrically erasable and programmable semiconductor memory, if address and data are input (step S2), application of program pulse to a selected memory cell is started, and data is programmed in the memory cell (step S3). After the application of program pulse is stopped, if a program verify command is input, the memory is brought into a program verify mode (step S4), and reading operation of data from the programmed memory cell is started (step S5). The data is read, and the read data and an initially inputted expected value (reference) data are compared with each other (step S6). If they coincide with each other, the program is normally completed, the memory is brought into a reading mode, and the program is completed. If they do not coincide with each other, the program pulse is again applied (step S7). This series of operation is repeated until all data coincides with each other. FIG. 15 is a timing chart showing that after the program pulse is applied, a series of operation for carrying out the verify operation is executed, and since the expected value data and programmed data coincide with each other through three trials, the program is completed.

As described above, in the electrically erasable and programmable semiconductor memory (EEPROM), the program pulse is applied until the expected value data and programmed data coincide with each other and then, the series of operation in which the verify operation is carried out is repeated, thereby setting a threshold voltage of a memory cell to a desired value.

The above technique can also be employed for a memory using an RRAM (Novel resistance control nonvolatile RAM) which is a nonvolatile variable resistive element which becomes a focus of attention.

If the conventional program verify function is employed, as compared with an EEPROM not having the program verify function, it is possible to reduce the variation in threshold value. However, while the program pulse is applied, the programming operation is forcibly carried out. Therefore, there is an adverse possibility that the threshold value of the memory cell largely exceeds a desired value during application. The characteristics of the memory cell are varied due to variation of producing process thereof as described above. Therefore, if the programming characteristics are considered, there are memory cells which can easily be programmed and memory cells which are difficult to be programmed. Thus, it is difficult to optimally and uniformly set the application time. A semiconductor memory using a nonvolatile variable resistive element such as an RRAM has the same problem, and it is difficult to set a resistant value to a desired value. Especially in a semiconductor memory such as the RRAM, when multilevel technique for storing a state of one of a plurality of resistant states in one memory cell is employed, it is necessary to set the resistant value having small variation. In the above conventional technique, however, it is difficult to precisely set the resistant value. There is also a problem that after the program pulse is applied, since the series of verify operation must be repeated, the programming time becomes long.

SUMMARY OF THE INVENTION

It is an object of the present invention to provide a multilevel semiconductor memory device and a multilevel programming method of a memory cell capable of shortening time required for programming processing and capable of precisely programming data into a memory cell.

To achieve the above object, the distinctive structure of the semiconductor memory device according to the present invention is that the semiconductor memory device comprises a memory cell having a variable resistive element whose electrical resistance is varied, programming means for programming data into the memory cell using the variation of the electrical resistance of the variable resistive element, programming state detection means for detecting variation in the electrical resistance at the time of programming operation carried out by the programming means, and programming control means for stopping the programming operation by the programming means when the electrical resistance is varied to a predetermined reference value. Further, the distinctive feature of the programming method in the memory cell is that data is programmed into the memory cell having a variable resistive element whose electrical resistance is varied, and the variation of the electrical resistance at the time of the programming operation is carried out simultaneously together with the programming operation, the variation of the electrical resistance at the time of the programming operation is detected, and the programming operation is carried out until the variation reaches a predetermined reference value.

That is, by programming data into the memory cell and verifying concurrently, the time required for programming data and for verifying can be shortened. Since the programming processing can be stopped when the electrical resistance reaches the predetermined reference value, it is possible to precisely set the resistance value to a target reference value and thus, the semiconductor memory device is excellent in multilevel properties.

It is preferable that the semiconductor memory device further comprises erasing means for erasing data from the memory cell using variation of the electrical resistance of the variable resistive element, erasing state detecting means for detecting variation of the electrical resistance at the time of the erasing operation by the erasing means, and erasing control means for stopping the erasing operation by the erasing means when the electrical resistance is varied to a predetermined second reference value.

In this case, by erasing data from the memory cell and verifying concurrently, the time required for erasing data and for verifying can be shortened. Since the erasing processing can be stopped when the electrical resistance reaches the predetermined second reference value, it is possible to precisely set the resistance value to a target reference value. Since the application of voltage to the memory cell is stopped when the electrical resistance reaches the predetermined reference value, the consumed current can also be reduced.

The memory cell preferably includes a variable resistive element whose electrical resistance is held even after the electrical resistance is varied by electrical stress and the electrical stress is released like the RRAM element, and an oxide of perovskite structure having manganese is used. If this is compared with a nonvolatile memory such as an EEPROM, the program pulse application time is short. The EEPROM has program pulse application time of about 1 $\mu$s, but the nonvolatile variable resistive element memory has program pulse application time of about 100 ns.

It is preferable that the programming state detection means can detect by comparing the variation in the electrical resistance of the memory cell with the reference value fixed to a programming reference cell. The reference cell is preferably formed using a fixed resistance whose electrical stress is not varied in view of precision, and the fixed resistance is preferably formed of diffused resistor or polysilicon resistor in view of producing easiness.

It is preferable that the erasing state detecting means can detect by comparing the variation in the electrical resistance of the memory cell and the second reference value fixed to the erasing reference cell. The erasing reference cell is preferably formed using a fixed resistance whose electrical stress is not varied in view of precision, and the fixed resistance is preferably formed of diffused resistor or polysilicon resistor in view of producing easiness.

DETAILED DESCRIPTION OF THE INVENTION

A semiconductor memory device and a programming and erasing method of a memory cell according to the present invention will be explained below based on the drawings.

Figure 1:
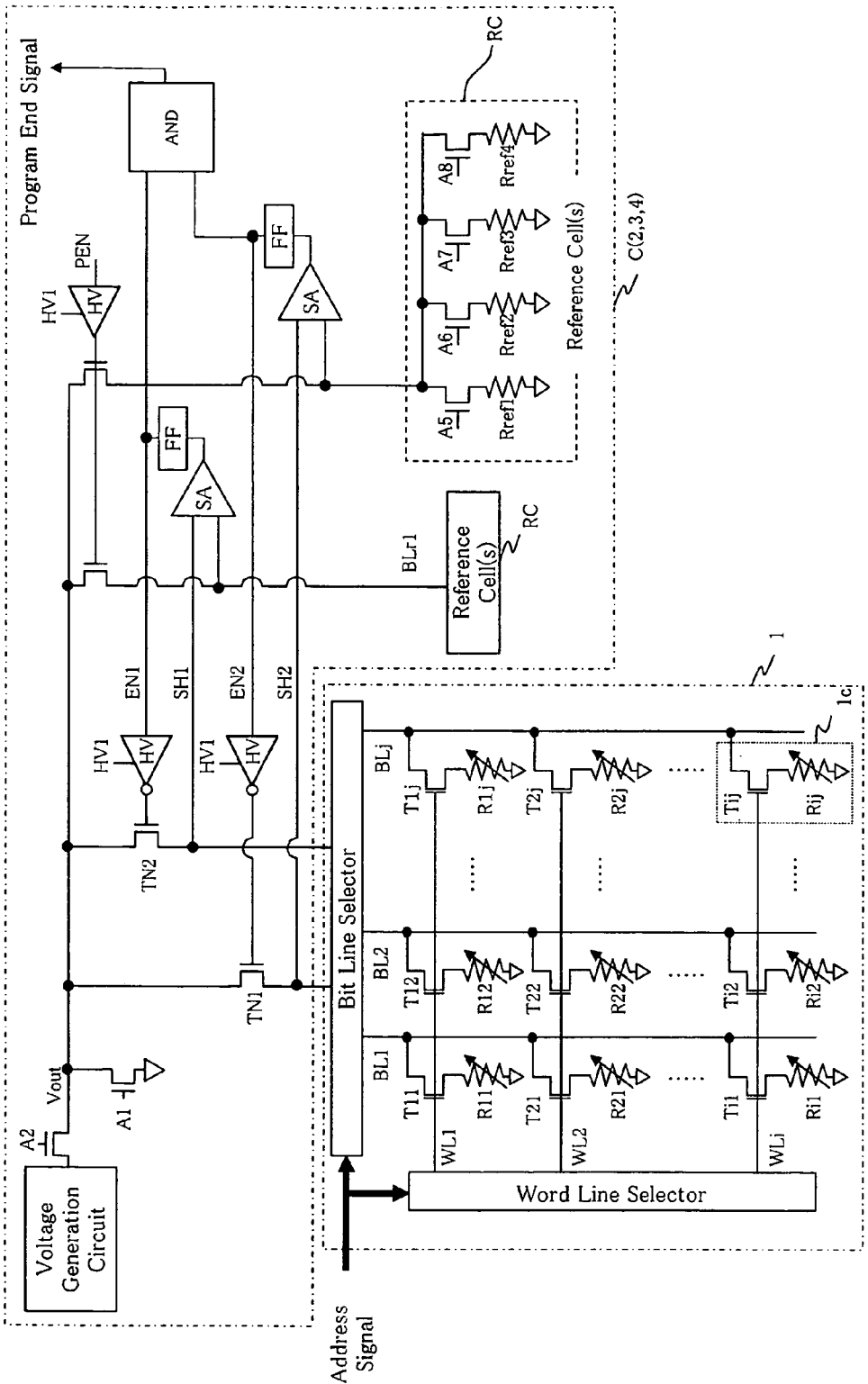
FIG. 1 is a circuit block diagram showing an embodiment of a semiconductor memory device according to the present invention.

As shown in FIG. 1, the semiconductor memory device comprises: nonvolatile variable resistive elements $R_{11}$ to $R_{ij}$ such as RRAMs in which electrical resistance is changed by electrical stress and even after the electrical stress is released, the changed electrical resistance is held; a memory array 1 in which memory cells 1c having selection transistors $T_{11}$ to $T_{ij}$ comprising N type MOSFETs are arranged with a matrix; and a control circuit C. The control circuit C functions: as programming means 2 which applies electrical stress to the variable resistive elements $R_{11}$ to $R_{ij}$ to change the electrical resistance, thereby programming data into the memory cells 1c; as programming state detection means 3 which detects the change in the electrical resistance when the programming means 2 programs data; and as control means 4 which causes the programming state detection means 3 to apply electrical stress when the electrical resistance is changed to a predetermined reference value. Concrete operations thereof will be described later.

Each of the variable resistive elements $R_{11}$ to $R_{ij}$ is an RRAM element which electrical resistance is changed by electrical stress and even after the electrical stress is released, the changed electrical resistance is held. The RRAM element is made of manganese oxide film of a perovskite structure having manganese, and is formed into a film using an MOCVD method, a spin coating method, a laser ablation, a sputtering method or the like. Examples of the material of the manganese oxide film are $Pr_{(1-x)}Ca_xMnO_3$, $La_{(1-x)}Ca_xMnO_3$ and $La_{(1-x-y)}Ca_xPb_yMnO_3$ (wherein, x<1, Y<1, x+y<1), such as $Pr_{0.7}Ca_{0.3}MnO_3$, $La_{0.65}Ca_{0.35}MnO_3$, $La_{0.65}Ca_{0.175}Pb_{0.175}MnO_3$.

In the present specification, when "resistance value of the RRAM element is increased" is expressed as "programmed", and when data is programmed, the selection transistor is turned ON to apply 3V to the bit line and 0V to the source line, and when "resistance value of the RRAM element is reduced" is expressed as "erased", and data is erased, the selection transistor is turned ON and voltage of opposite pole is applied, and when the data is read, the selection transistor is turned ON to apply 1.5V to the bit line and 0V to the source line. The voltage value is switched and supplied by a voltage generating circuit, and its value is not limited to the above-described value, and the value may appropriately be set in accordance with characteristics of the nonvolatile variable resistive element.

The memory cells 1c can be individually selected by outputs WL1, WL2 ... WLi from a word line selector and from outputs BL1, BL2 ... BLj from a bit line selector by address signal. One end of the variable resistive element is connected to a ground level. The bit line selector is connected to two nodes SH1 and SH2 in this explanation, but when data is read from or programmed into 16 cells simultaneously, 16 nodes SH1 to SH16 are required.

The control circuit C will be explained next. The nodes SH1 and SH2 are selectively connected to the ground level or an output of the voltage generating circuit through TN1 and TN2 each comprising N type MOSFET, and are connected to input terminals of two sense amplifier circuits SA. Other input terminals of the sense amplifier circuits SA are connected to a reference cell circuit RC, and are connected to a Vout node through a N type MOSFET which is turned ON/OFF by means of a program enable signal (program-permissible signal) PEN.

The reference cell circuit RC has the same number of circuits as a number selected by the bit line selector. Each the reference cell circuit RC includes reference resistances Rref1 to Rref4 which become the predetermined reference values, and selection transistors A5 to A8 for selecting the reference resistances. FIG. 1 shows an example of programming 4-level data. The example includes four reference resistances which become expected value data. Each the reference resistance has a relation of Rref1<Rref2<Rref3<Rref4. The reference cell is formed of fixed resistance which is not varied by electrical stress such as application of voltage or current. It is preferable that the reference cell is formed of diffused resistor or polysilicon resistor.

An output of the sense amplifier circuit SA is connected to an input of a flip-flop circuit FF, and an output of the flip-flop circuit FF is connected to gates of TN1 and TN2 comprising N type MOSFETs through an AND circuit and a high voltage driver circuit. The gate voltage here is converted into voltage which is sufficiently higher than voltage outputted from the voltage generating circuit by the high voltage driver circuit. A signal indicative of completion of programming operation to each the selected memory cell is transmitted to the AND circuit, and when the programming operation to all of the selected memory cells is completed, a programming completion signal is outputted.

Figure 3:
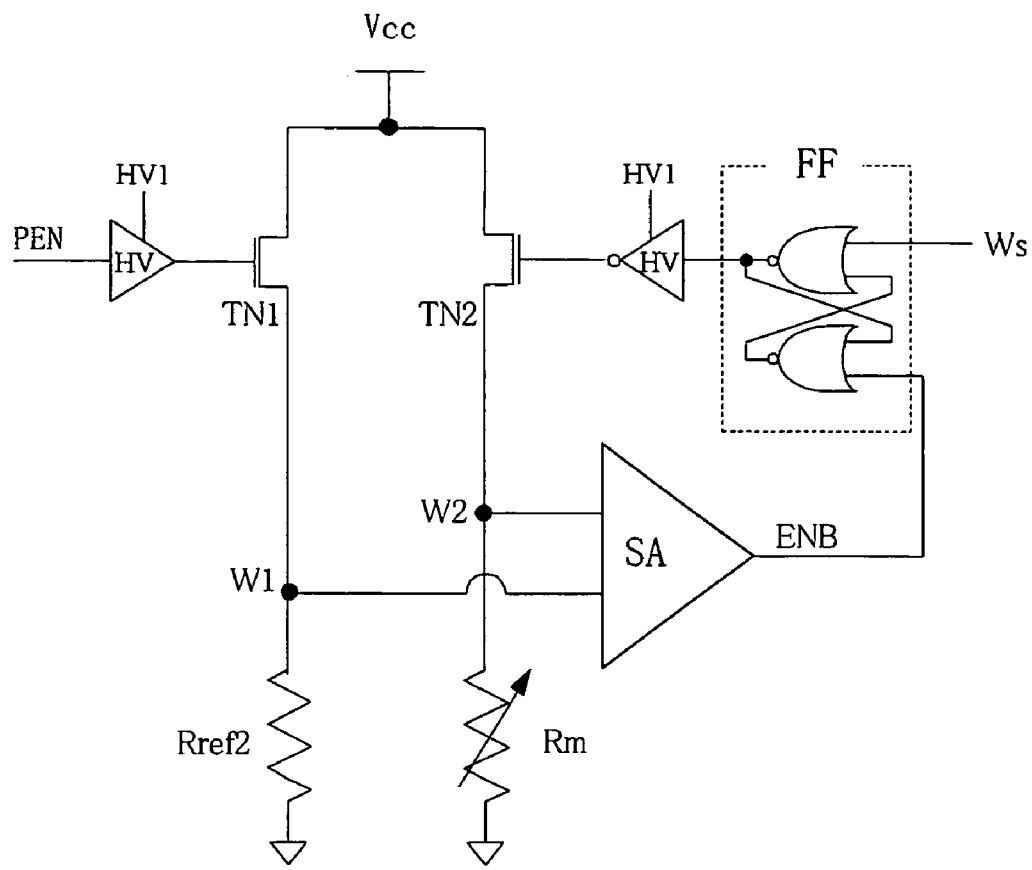
FIG. 3 is a circuit block diagram of an essential portion of the semiconductor memory device of the invention.

Next, a concrete programming operation to the selected memory cell will be explained based on FIG. 3 which shows only basic circuit structure while omitting the selection transistor of the memory cell of FIG. 1. Here, a case in which the second reference resistance Rref2 is selected and the selection transistor is omitted will be explained. Among the plurality of memory cells comprising the variable resistive elements, the variable resistive element Rm of the selected memory cell is connected to a source of TN2 and an input terminal of the sense amplifier circuit SA through the node W2, the reference resistance Rref2 is connected to a source of TN1 and an input terminal of the sense amplifier circuit through the node W1. A drain of TN1 is connected to a source voltage Vcc, its gate receives a program enable signal PEN, and a signal which is converted into voltage HV1 which is sufficiently higher than the source voltage Vcc by the high voltage driver circuit HV is applied to the gate. A drain of the TN2 is connected to the source voltage Vcc, its gate receives a signal outputted from the flip-flop circuit FF, and a signal which is converted into voltage HV1 sufficiently higher than the source voltage Vcc by the high voltage driver circuit HV is applied to the gate. A program start signal Ws and an output signal of the sense amplifier circuit SA are inputted to an input signal of the flip-flop circuit FF.

Figure 2:
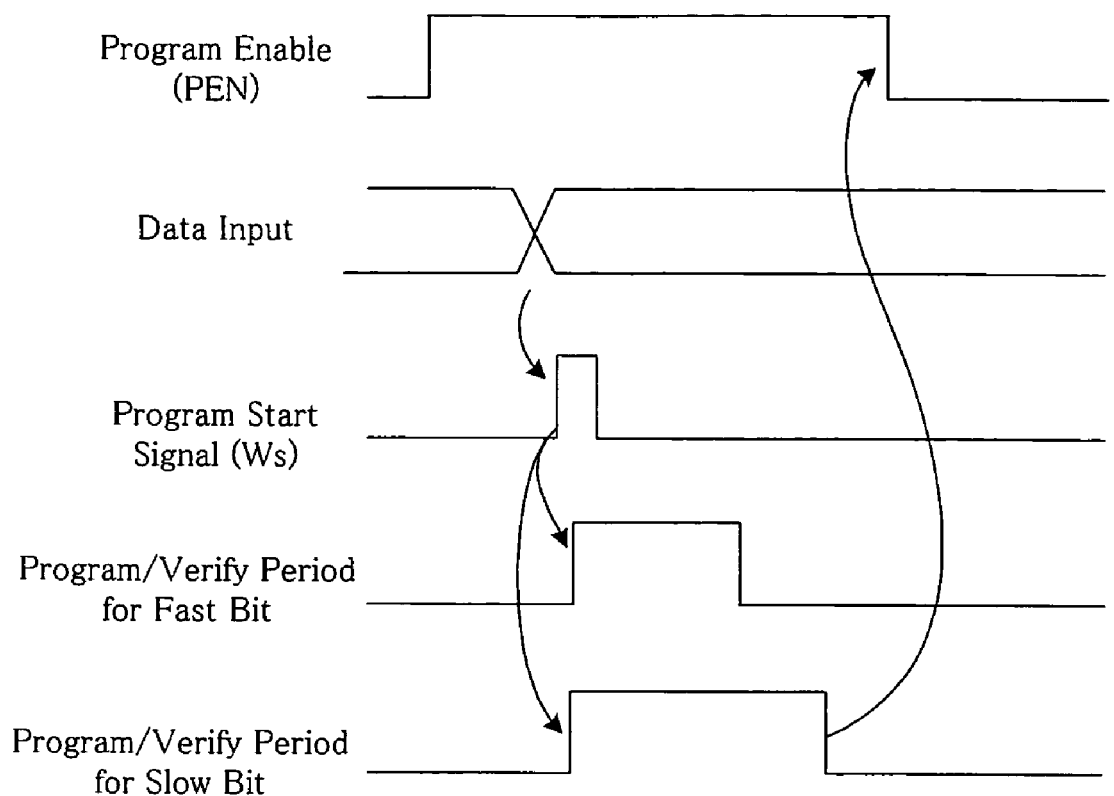
FIG. 2 is a timing chart of data programming processing carried out by the semiconductor memory device of the invention.

The operation of the circuit will be explained based on the timing chart shown in FIG. 2. First, when the program enable signal PEN becomes high level, the TN1 is turned into ON state, the reference cell resistance Rref2 is selected by inputting data, and current flows from the source voltage to the ground level through the TN1 and the reference cell resistance Rref2. At that time, the node W1 has first voltage due to division of resistance between ON resistance and resistance of the reference cell resistance Rref2. Next, a program start signal Ws becomes high level, and when the TN2 is turned into ON state, current flows from the source voltage into the ground level, thereby starting the programming into the variable resistive element Rm. Thereafter, the program start signal Ws becomes low level, but since the data is latched by the flip-flop circuit FF, the programming operation is continued. Here, if the transistor abilities of the TN1 and TN2 are equal to each other, the same current flows when the reference resistance Rref2 and the variable resistive element Rm of the selected memory cell become equal to each other. When the variable resistive element Rm of the selected memory cell is smaller than the reference resistance Rref2, since the resistance value of the variable resistive element Rm of the selected memory cell is low, the node W2 is lower than the node W1 in voltage, and programming pulse is applied until the variable resistive element Rm becomes equal to the reference resistance Rref2. Therefore, by inputting the node W1 and node W2 to the sense amplifier circuit SA, it can be judged whether the variable resistive element Rm of the selected memory cell is lower than the resistance value of the reference resistance Rref2, and when the resistance value of the variable resistive element Rm of the selected memory cell becomes equal to the resistance value of the resistance value of the reference resistance Rref2, the output signal ENB of the sense amplifier circuit SA becomes high level, and the TN2 is brought into OFF state and thus, the application of voltage is stopped and the programming operation is completed. Here, a fast bit shown in FIG. 2 means an element having a fast programming speed into the variable resistive element Rm of the selected memory cell from the application of voltage to a predetermined level, and a slow bit is an element having the slow programming speed to the variable resistive element Rm of the selected memory cell from the application of voltage to a predetermined level. FIG. 2 shows variation in characteristics of the element.

The above-described circuit comprises programming means 2 which applies the electrical stress to the variable resistive elements $R_{11}$ to $R_{ij}$ to change the electrical resistance and programs data into the memory cell 1c, programming state detection means 3 which detects variation in the electrical resistance when the programming means 2 programs data, and programming control means 4 which stops application of the electrical stress by the programming state detection means 3 when the electrical resistance reaches a predetermined reference value.

According to the above-described programming method of the semiconductor memory device and memory cell, since the programming operation and the verifying operation are carried out simultaneously for each of the memory cells, the method has a feature that the programming voltage applying time is different between the memory cells and variation between the elements is absorbed. With this feature, not only the excessive programming can be prevented, but also the consumed current can be reduced.

In the above description, among the plurality of reference resistances, the second reference resistance is selected, the selected memory cell is set to the second resistance. In addition to this, it is also possible that the third reference resistance is selected and the memory cell is set to the third resistance, or the fourth reference resistance is selected and the memory cell is set to the fourth resistance, of the first reference resistance is selected and the memory cell is set to the first resistance.

Figure 4:
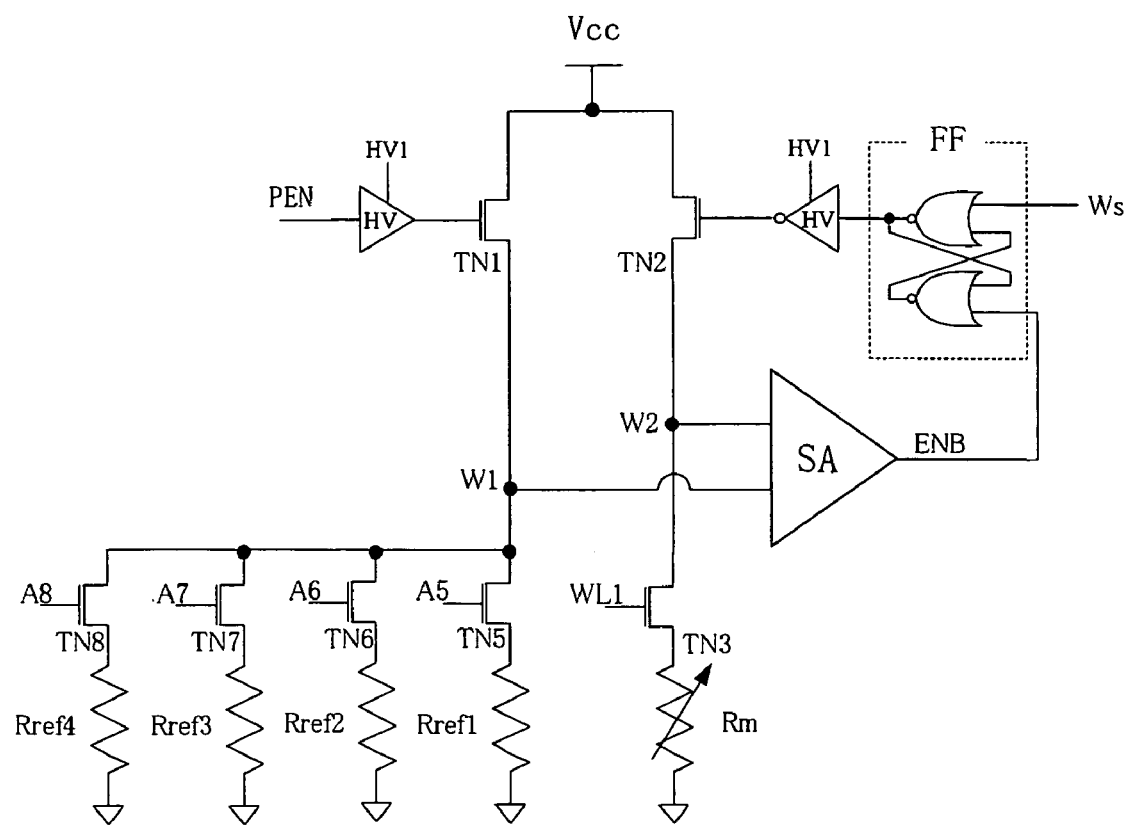
FIG. 4 is a circuit block diagram of the essential portion of the semiconductor memory device of the invention.

The invention will be explained based on FIG. 4 which only shows the basic circuit structure shown in FIG. 1. Among the plurality of memory cells comprising the variable resistive elements, two terminals of the variable resistive element Rm of the selected memory cell are connected to a source of the selection transistor TN3, and the ground level, respectively, a drain of the selection transistor TN3 is connected to a source of the TN2 and the input terminal of the sense amplifier circuit SA through the node W2, and a drain of the TN2 is connected to the source voltage Vcc. One ends of the first reference resistance Rref1, the second reference resistance Rref2, the third reference resistance Rref3 and the fourth reference resistance Rref4 are respectively connected to sources of TN5, TN6, TN7 and TN8 comprising N type MOSFETs, and the other terminals are connected to the ground level. Drains of the TN5, TN6, TN7 and TN8 are connected to the source of the TN1 and the input terminal of the sense amplifier circuit SA through the node W1, and nodes A5, A6, A7 and A8 are connected to the gates, respectively. A drain of the TN1 is connected to the source voltage, the gate receives the program enable signal PEN, and is connected, through the high voltage driver circuit HV, to a node which is converted into voltage HV2 which is sufficiently higher than the source voltage Vcc. The output of the sense amplifier circuit SA and the program start signal Ws are input to the flip-flop circuit FF, the output of the flip-flop circuit FF is converted into voltage HV1 which is sufficiently higher than the source voltage Vcc through the high voltage driver circuit HV and then is inputted into the gate of the TN2.

First, in order to select the first memory cell, the WL1 is tuned into high level, and a resistance value which is desired to be set is selected from the Rref1 to Rref4. Assume that the third reference resistance Rref3 is to be selected, the signal A7 is turned into high level, and the signals A5, A6 and A8 are turned into low level. With this, the TN7 is brought into ON state, and the TN5, TN6 and TN8 are brought into OFF state. Next, the program enable signal PEN is brought into high level, thereby bringing the TN1 into ON state, and current flows from Vcc to the ground level through the TN1, TN7 and reference resistance Rref3. With this, the node W1 is brought into an intermediate potential by division of these resistances. Next, the program start signal Ws is brought into high level, and the TN2 is brought into ON state. Thereafter, even if the program start signal Ws is brought into low level, data is latched by the flip-flop circuit. Since TN2 is turned ON, resistance value of the variable resistive element Rm is varied through the TN2, TN3 of the selected memory cell and the variable resistive element Rm, and current flows into ground level from the source voltage. Here, if the transistor abilities of the TN1 and TN2 as well as TN3 and TN7 are equal to each other, when the reference resistance and variable resistive element Rm of the selected memory cell become the same resistance value, equal current flows. When resistance value of the variable resistive element Rm of the selected memory cell is lower than that of the reference resistance Rref3, the variable resistive element Rm is brought into a programming state due to difference in potential to be applied. When the resistance value of the variable resistive element Rm is lower than that of the reference resistance, voltage of the node W2 of the variable resistive element Rm is lower than that of the node W1. That is, by inputting the node W1 and node W2 into the sense amplifier circuit SA, it is possible to judge whether the resistance value of the variable resistive element Rm is lower than that of the reference resistance. Further, the resistance value of the variable resistive element Rm of the selected memory cell becomes equal to that of the reference resistance, and when the resistance value of the variable resistive element Rm of the selected memory cell becomes greater than that of the reference resistance, the output signal ENB of the sense amplifier circuit becomes high level and the TN2 is brought into OFF state and thus, the application of voltage is stopped and the programming operation is completed.

That is, the variable resistive element Rm of the selected memory cell can store four states by selecting one of the four kinds of reference resistances. Namely, among the reference resistances, if a state of the first resistance Rref1 is defined as "00" and a state of the second resistance Rref2 is defined as "01" and a state of the third resistance Rref3 is defined as "10" and a state of the fourth resistance Rref4 is defined as "11", the first selected memory cell can store the four states 00, 01, 10 and 11. The above example includes four kinds of reference resistances and two bit data can be stored in the variable resistive element Rm of the selected memory cell. However, if the number of kinds of the reference resistances is increased, more data can be stored.

Figure 5:
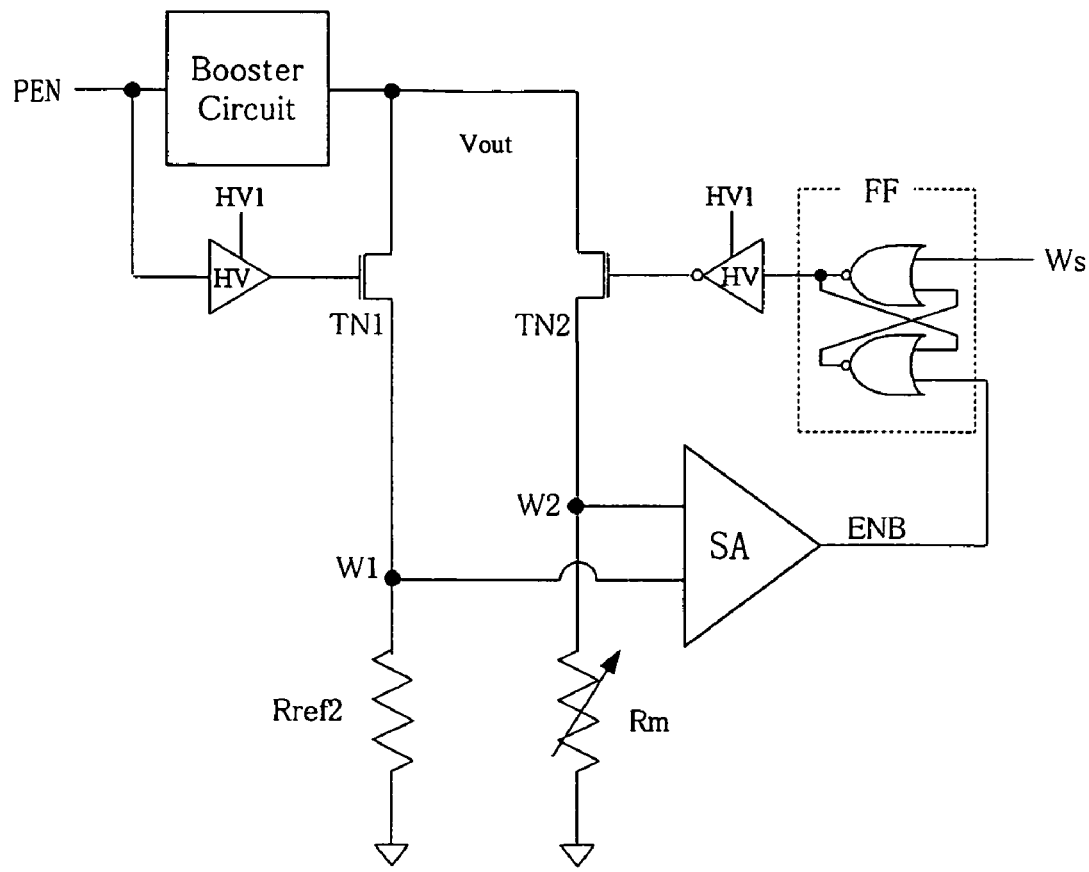
FIG. 5 is a circuit block diagram of an essential portion of a semiconductor memory device of another embodiment of the invention.

A second embodiment will be explained below. As shown in FIG. 5, when programming voltage of data into a memory element 1c must be higher than the source voltage, the second embodiment includes a booster circuit. An output Vout of the booster circuit is connected to drains of TN1 and TN2, the booster circuit receives the program enable signal PEN, thereby actuating the booster circuit. The output Vout of the booster circuit is used as program voltage. FIG. 5 also shows only the basic circuit structure while omitting the selection transistor of the memory cell and the like.

Figure 6:
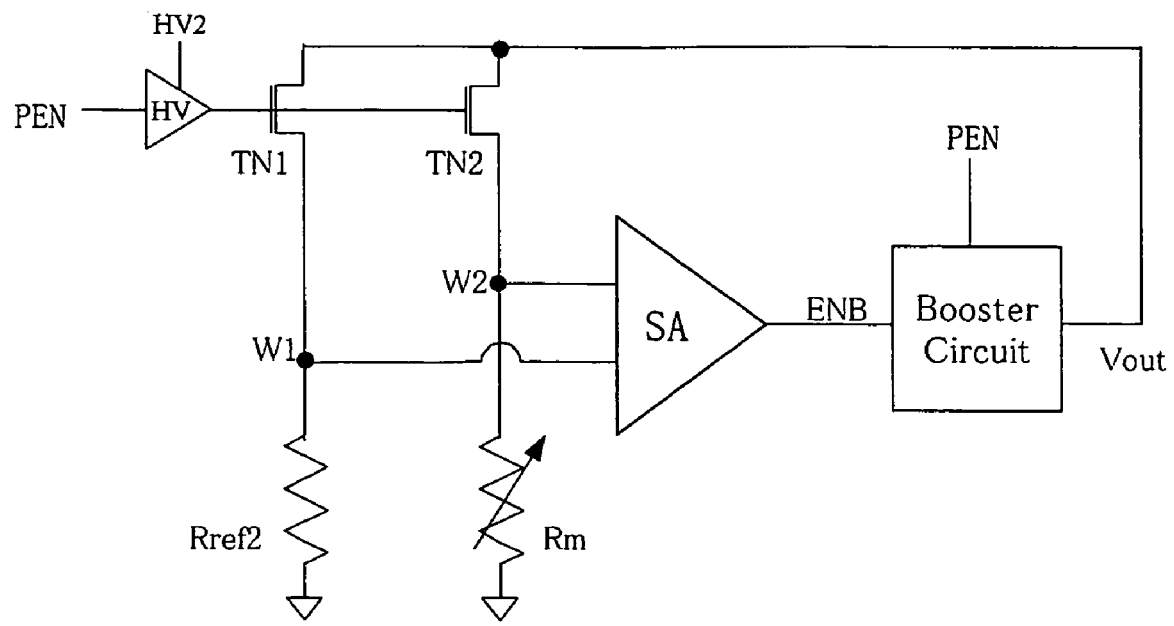
FIG. 6 is a circuit block diagram of an essential portion of a semiconductor memory device of another embodiment of the invention.

In the above embodiment, the control circuit controls whether the programming voltage should be applied to the variable resistive element Rm of the selected memory cell by turning the transistor ON or OFF. Alternatively, the control circuit may control whether the programming voltage should be applied to the variable resistive element Rm of the selected memory cell depending upon whether the voltage should be supplied from the output of the booster circuit as shown in FIG. 6. More specifically, the variable resistive element Rm of the selected memory cell among the plurality of memory cells comprising the variable resistive elements, the variable resistive element Rm of the selected memory cell is connected to the source of TN2 and the input terminal of the sense amplifier circuit SA by means of the node W2, the reference resistance Rref2 is connected to the source of TN1 and the input terminal of the sense amplifier circuit SA through the node W1. The drains of TN1 and TN2 are connected to the output Vout from the booster circuit, and the gates thereof receive the program enable signal PEN and a signal whose voltage is converted into voltage HV2 which is sufficiently higher than the set-up voltage Vout is applied to the gates. An actuation signal ENB of the booster circuit is output from the sense amplifier circuit SA. In order to program the variable resistive element Rm of the selected memory cell, i.e., in order to program predetermined data, the booster circuit is actuated after the program enable signal PEN becomes high level, and voltage is applied to the variable resistive element Rm of the selected memory cell and the reference resistance Rref2. When the node W1 which is resistance partial pressure between TN1 and reference resistance Rref2, and the node W2 which is resistance partial pressure between TN2 and the variable resistive element Rm of the selected memory cell reach the same voltage, the booster circuit is stopped, the application of voltage to the variable resistive element Rm of the memory cell is stopped, and the programming operation is completed.

The control circuit C comprises programming means 2 for applying electrical stress to the variable resistive elements $R_{11}$ to $R_{ij}$ to program data into the memory cell 1c, programming state detection means 3 for detecting the electrical resistance at the time of the programming operation, and programming control means 4 for stopping the application of the electrical stress when the electrical resistance is varied to a predetermined reference value. However, the control circuit C is not limited to this structure, and may be configured using a known logic circuit.

Figure 7:
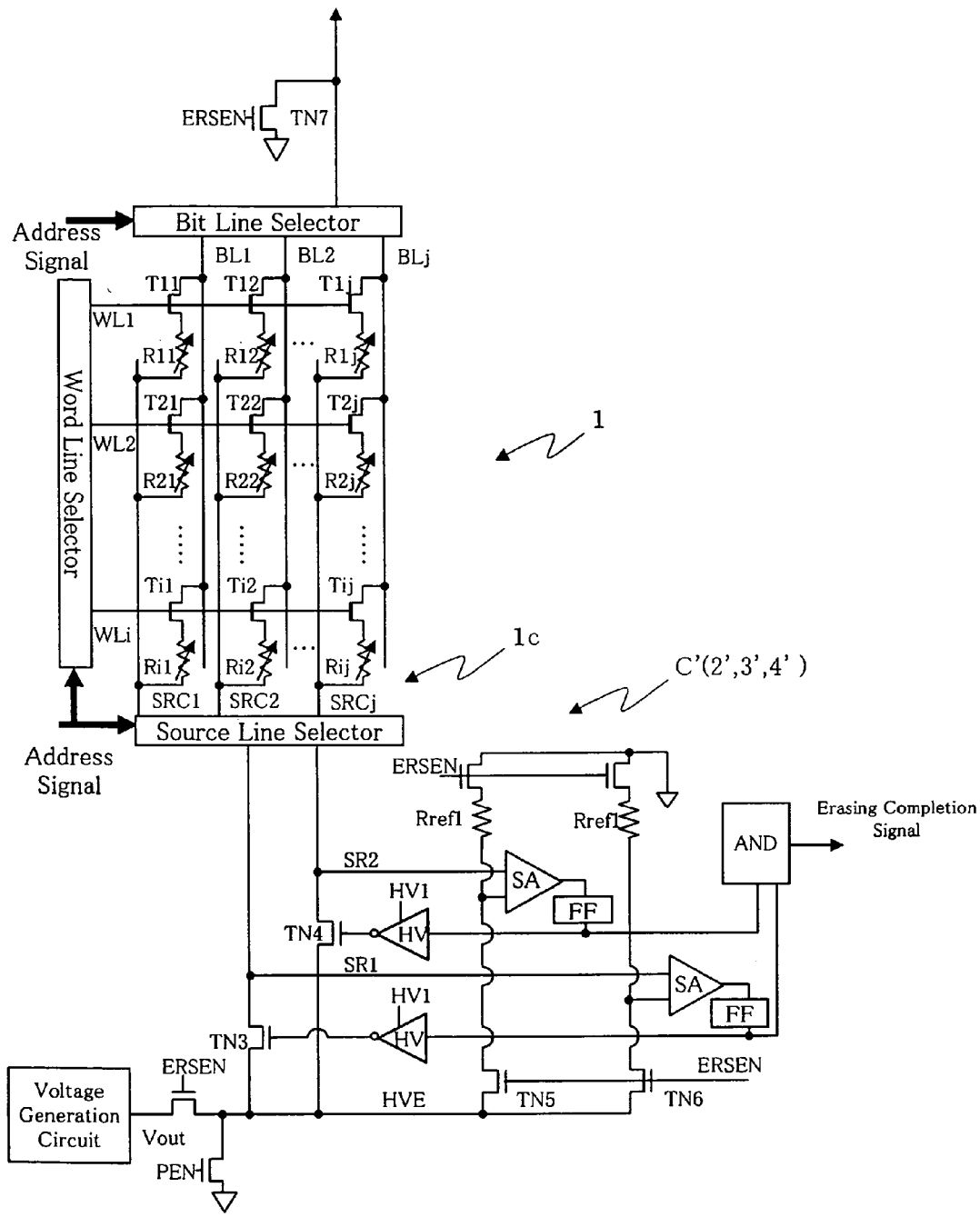
FIG. 7 is a circuit block diagram of an essential portion of a semiconductor memory device of another embodiment of the invention.

A third embodiment of the semiconductor memory device of the invention will be explained next. Elements corresponding to the first embodiment will be explained briefly. As shown in FIG. 7, the semiconductor memory device comprises a control circuit C' which functions: as a memory array 1 in which memory cells 1c having the above-described variable resistive elements $R_{11}$ to $R_{ij}$ and N type MOSFETs are arranged with matrix; as erasing means 2' for erasing data from the memory element 1c by applying the electrical stress to the variable resistive elements $R_{11}$ to $R_{ij}$ to change the electrical resistance; as erasing state detecting means 3' for detecting variation in electrical resistance at the time of the erasing operation by the erasing means 2'; and as erasing control means 4' for stopping the application of the electrical stress by the erasing state detecting means 3' when the electrical resistance is varied to a predetermined reference value.

The memory cell 1c is selected by outputs WL1, WL2 ... WLi from the word line selector and outputs BL1, BL2 ... BLj from the bit line selector by means of address signal, and source lines SRC1, SRC2 . . . SRCj on one ends of the variable resistive elements $R_{11}$ to $R_{ij}$ are connected to the source line selector. The source line selector which individually selects the plurality of source lines SRC is connected to the two nodes SR1 and SR2 in this explanation, but when 16 cells are simultaneously erased, it is necessary to prepare 16 nodes SR1 to SR16.

The nodes SR1 and SR2 are selectively connected to the ground level or the output Vout of the voltage generating circuit through the TN3 and TN 4 comprising N type MOSFETs. The nodes SR1 and SR2 are connected to an input terminal of one of two sense amplifier circuits SA. A reference cell circuit is connected to the other input terminal of the sense amplifier circuit SA, and is connected to an HVE node through TN5 and TN6 comprising N type MOSFETs which are turned ON and OFF by the erasing enable signal ERSEN having sufficiently high voltage.

Each of the sense amplifier circuits SA has a reference cell circuit. Each the reference cell circuit includes a reference resistance Rref1 which becomes expected value data, and a selection transistor for selecting this reference resistance Rref1. The reference resistance Rref1 is a fixed resistance whose resistance is not varied by application of voltage or current. It is preferable that the reference cell is formed of diffused resistor or polysilicon resistor.

Figure 10:
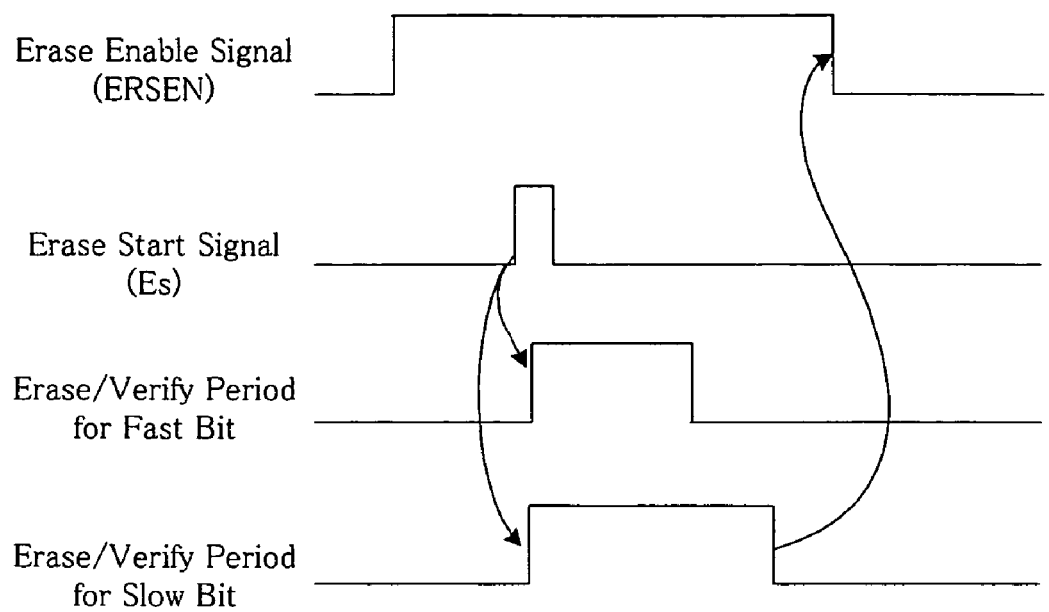
FIG. 10 is a timing chart of data erasing processing carried out by the semiconductor memory device of the invention.

The flip-flop circuit FF is connected to an output of the sense amplifier circuit SA, and an output of the flip-flop circuit FF is connected to gates of TN3 and TN4 comprising an AND circuit and a N type MOSFET, respectively. The gate voltage is converted into voltage which is sufficiently higher than output voltage from the voltage generating circuit. A signal indicative of completion of the erasing operation from the selected memory cell is transmitted to the AND circuit, and when the erasing operation from all the selected memory cells is completed, the AND circuit output the erasing operation completion signal. This timing chart is shown in FIG. 10. Here, fast bit and slow bit are respectively a cell having high erasing time and a cell having low erasing time due to variation of process, and the application of erasing voltage is stopped from the fast cells in succession.

Figure 8:
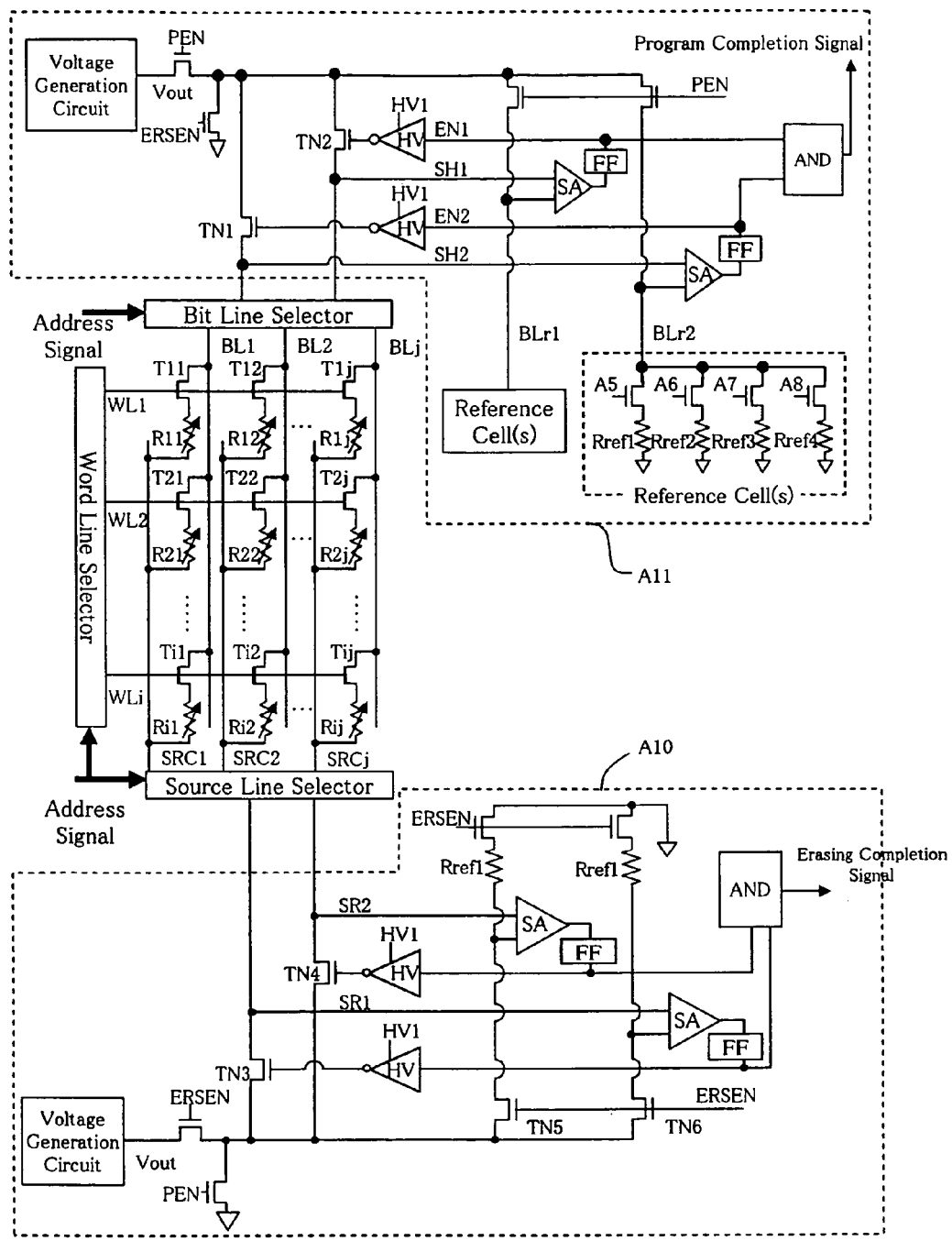
FIG. 8 is a circuit block diagram of an essential portion of a semiconductor memory device of another embodiment of the invention.

Next, a fourth embodiment will be explained. FIG. 8 shows one example of a circuit structure having both programming circuit and erasing circuit. Here, a programming circuit Al1 located closer to the bit line selector is added in addition to tan erasing circuit Al0(C') as a control circuit located closer to the source line selector shown in FIG. 7.

At the time of programming operation, the program enable signal PEN is brought into high level and the erasing enable signal ERSEN is brought into low level, voltage is supplied to the bit line side, the source line side becomes the ground level and the programming operation is carried out. At that time, control is made such that column switches TN3 and TN4 on the side of the source line become ON state. At the time of erasing operation, the program enable signal PEN is brought into low level, the erasing enable signal ERSEN is brought into high level, voltage is supplied to the source line side, the bit line side becomes the ground level and the erasing operation is carried out. At that time, control is made such that the column switches TN1 and TN2 on the side of the bit line side becomes ON state so that current flows from the source line side into the bit line side and the erasing and verifying operations are simultaneously carried out.

Figure 9:
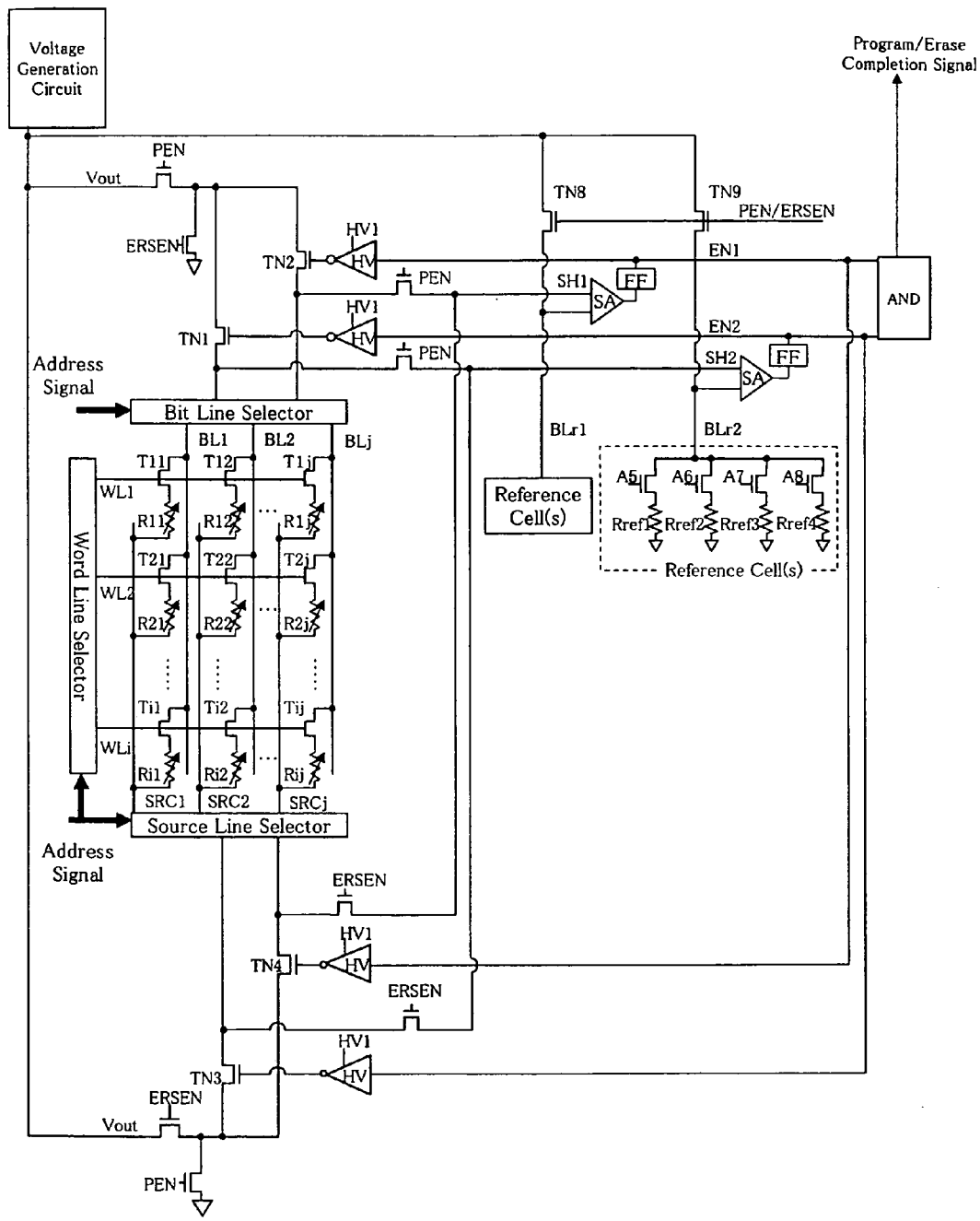
FIG. 9 is a circuit block diagram of an essential portion of a semiconductor memory device of another embodiment of the invention.

However, in the example shown in FIG. 8, the programming circuit and the erasing circuit require the voltage generating circuit and the sense amplifier, respectively, but if one element can function as both the voltage generating circuit and the sense amplifier, the area can be reduced. This example is shown in FIG. 9 as a fifth embodiment. This embodiment selects whether the output Vout of the voltage generating circuit should be supplied to the bit line side or source line side by switching the N type MOSFET, and the programming and erasing operations are carried out.

At the time of programming operation, the program enable signal PEN is brought into high level, and the erasing enable signal ERSEN is brought into low level, the output Vout is supplied to the voltage generating circuit on the bit line side, the source side becomes the ground level and the programming operation is carried out. At the time of erasing operation, the program enable signal PEN is brought into low level, the erasing enable signal ERSEN is brought into high level, the output Vout of the voltage generating circuit is supplied to the source side, the bit side becomes the ground level and the data is erased.

Concerning the input signal SH1 or SH2 into the sense amplifier circuit SA also, voltage is taken out from the bit line side or source line side in accordance with the program enable signal PEN and the erasing enable signal ERSEN, and the voltage is input into the sense amplifier circuit SA. In the reference cell circuit, the Rref1 is defined as an erasing reference cell, the Rref2 is defined as a second program cell, the Rref3 is defined as a third program cell and the Rref4 is defined as a fourth cell, thereby making it possible to erase and multilevel program.

Current flows into the ground level from the output Vout of the voltage generating circuit through the reference cell and the TN8 and TN9 comprising the N type MOSFETs which switch by means of the program enable signal PEN or the erasing enable signal ERSEN, and the resistance partial pressure at that time is input to the sense amplifier circuit SA. By employing the transistor which switches in accordance with the program enable signal PEN signal corresponding to the programming operation and the erasing enable signal ERSEN corresponding to the erasing operation in this manner, one element can serve as both the voltage generating circuit and the sense amplifier circuit.

Figure 11:
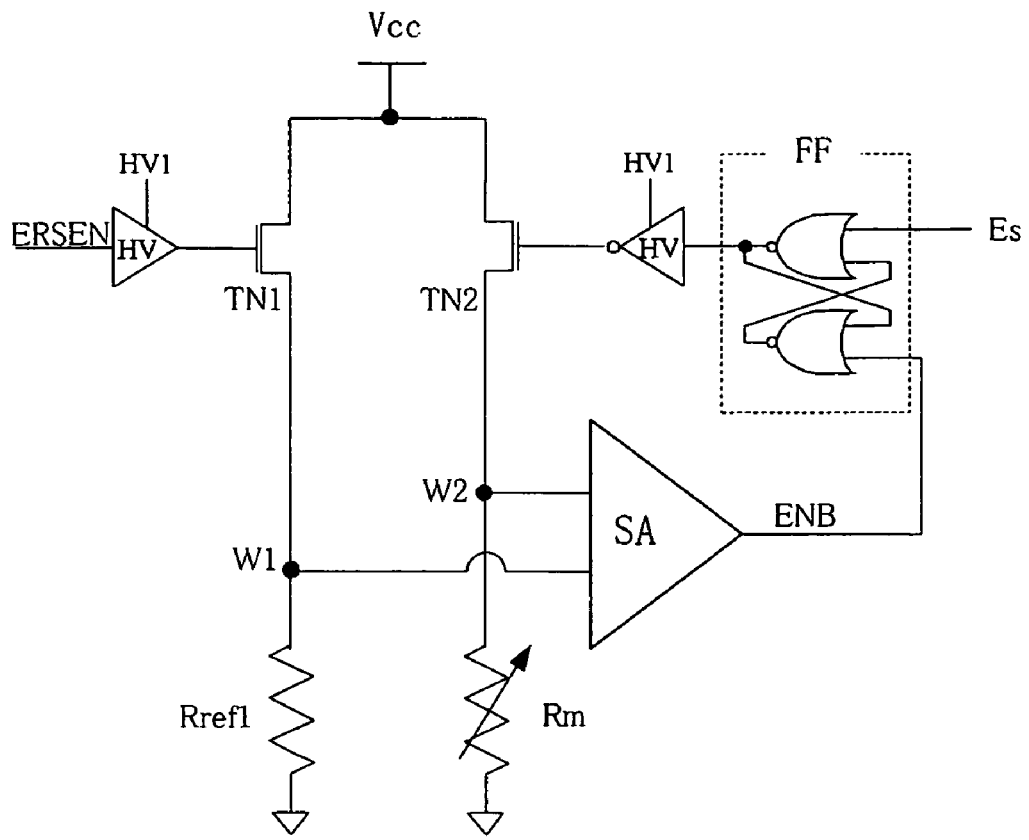
FIG. 11 is a circuit block diagram of an essential portion of a semiconductor memory device of another embodiment of the invention.

The concrete erasing operation to the selected memory cell of in the third to fifth embodiments will be explained below. For simplification, the explanation will be made with reference to FIG. 11 which shows only the basic circuit structure shown in FIG. 7. In this example, the selection transistor is omitted, and the erasing reference resistance Rref1 is selected. Although it is difficult to understand from the drawing, the selection transistor must be turned ON and voltage having opposite pole as that at the time of programming operation must be applied.

Among the plurality of memory cells comprising the variable resistive elements, the variable resistive element Rm of the selected memory cell is connected to the source of TN2 comprising the N type MOSFET and the input terminal of the sense amplifier circuit SA through the node W2. The reference resistance Rref1 whose resistance value is not varied by stress caused by current or voltage is connected to the source of the TN1 comprising the N type MOSFET and the input terminal of the sense amplifier circuit SA through the node W1. The drain of the TN1 is connected to the source voltage Vcc, the gate thereof receives the erasing enable signal ERSEN and a signal which is converted into voltage sufficiently higher than the source voltage Vcc is applied to the gate. The drain of the TN2 is connected to the source voltage Vcc, the gate thereof receives the output signal from the flip-flop circuit FF and a signal which is converted into voltage sufficiently higher than the source voltage Vcc is applied to the gate. The erasing voltage applying start signal Es and the output signal ENB of the sense amplifier circuit SA are input to the input signal of the flip-flop circuit.

In the above-described basic circuit structure, if the erasing enable signal ERSEN becomes high level, TN1 is brought into ON state, and current flows from the source voltage into the ground level through TN1 and the reference cell resistance. At that time, the node W1 has a first voltage which is determined by resistance division between the ON resistance of TN1 and the resistance of the reference cell resistance. Next, if the erasing signal Es is transmitted, the TN2 is brought into ON state. Thereafter, even if the Es becomes low level, since the data is latched by the flip-flop circuit FF, there is no problem. Since TN2 is ON, current flows from the source voltage to the ground level through TN2 and the selected memory cell Rm, and the selected memory cell Rm is erased. Here, if the transistor abilities of the TN1 and TN2 composed of the N type MOSFETs are equal to each other, equal current flows into TN1 and TN2 when the resistance of the reference resistance and the resistance of the selected memory cell Rm become equal to each other.

That is, by inputting the node W1 and node W2 into the sense amplifier circuit SA, it is judged whether the resistance of the selected memory cell is lower than that of the reference resistance, and when the selected memory cell becomes the resistance value which is equal to the reference resistance, the output signal ENB of the sense amplifier circuit SA becomes high level, the TN2 is brought into OFF state and thus, the application of voltage is stopped, and the erasing operation is completed. That is, the erasing operation and the verifying operation are carried out simultaneously. The method has a feature that the erasing voltage applying time is different between the memory cells. With this feature, not only the excessive erasing operation can be prevented, but also the consumed current can be reduced.

Figure 12:
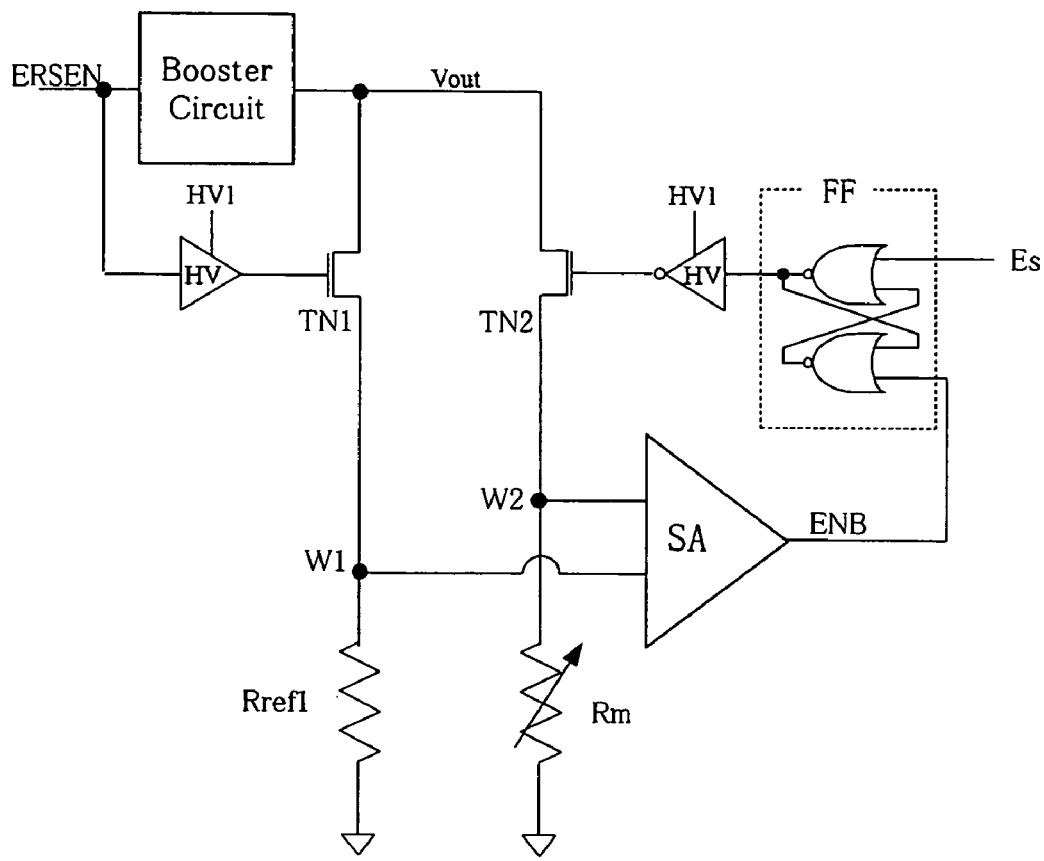
FIG. 12 is a circuit block diagram of an essential portion of a semiconductor memory device of another embodiment of the invention.

Next, when the source voltage is low or voltage higher than the source voltage is required for the erasing voltage, a circuit structure including the booster circuit can be considered. This structure is shown in FIG. 12. This structure is different from the structure shown in FIG. 11 in that output Vout of the booster circuit is connected to drains of TN1 and TN2, the circuit receives the erasing enable signal ERSEN to actuate the booster circuit, and the output Vout of the booster circuit is used as the erasing voltage.

Figure 13:
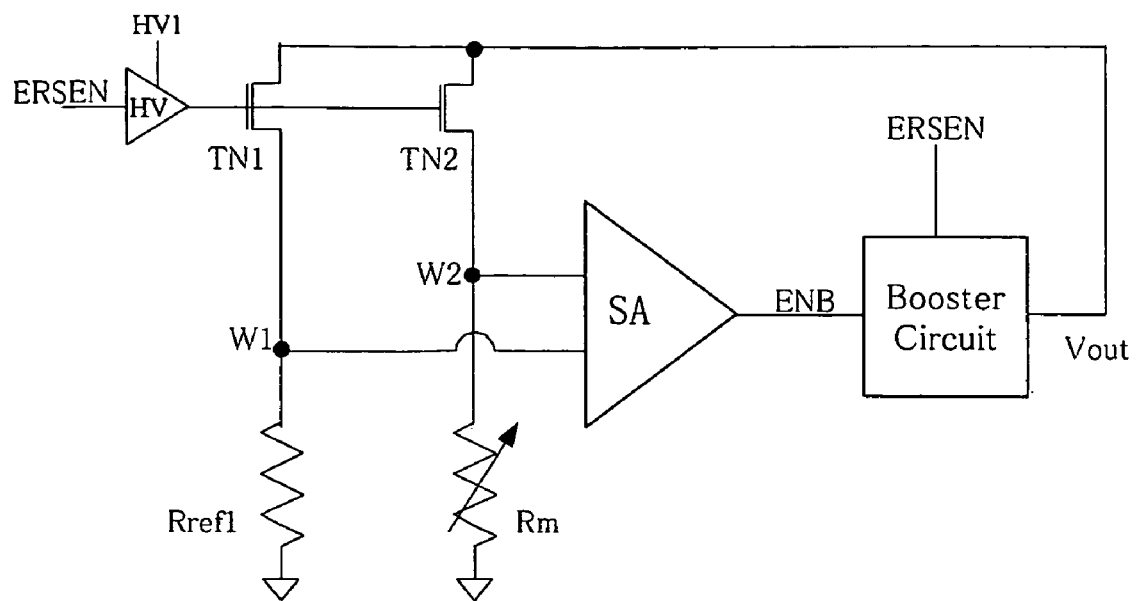
FIG. 13 is a circuit block diagram of an essential portion of a semiconductor memory device of another embodiment of the invention.
Figure 14:
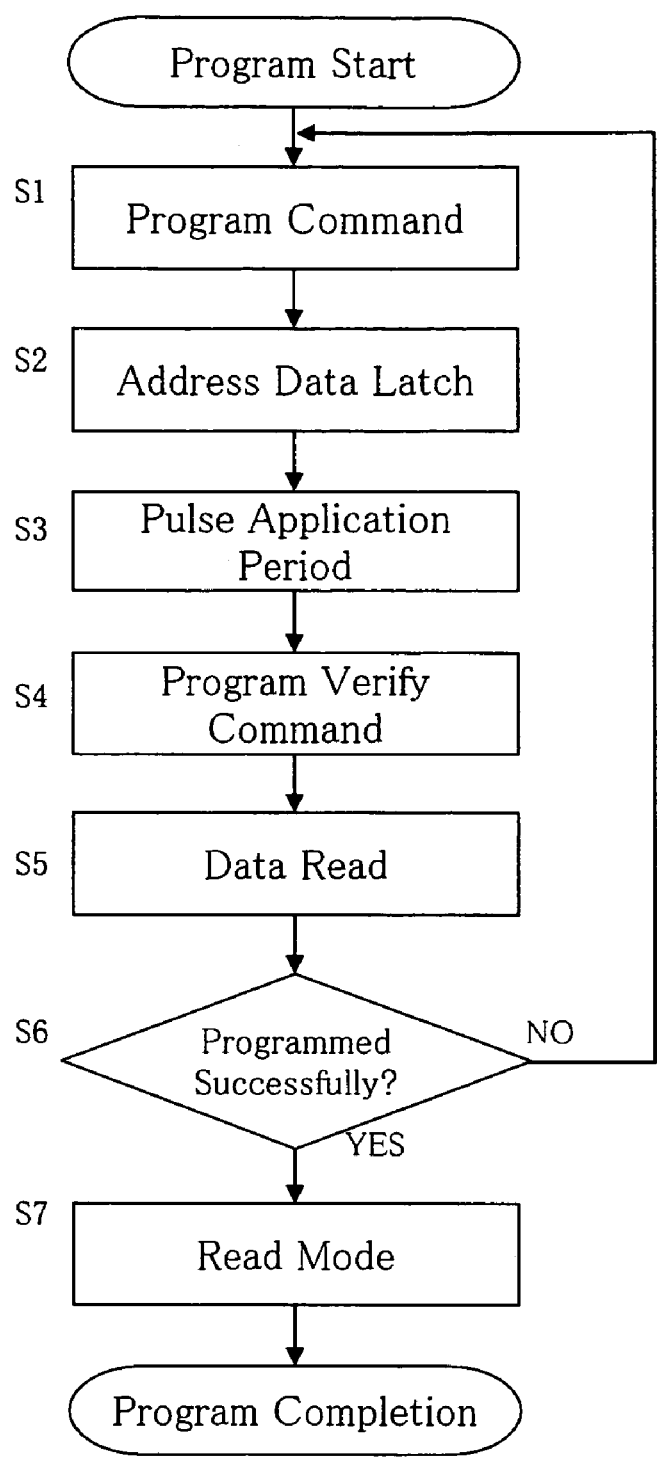
FIG. 14 is a flowchart for explaining a conventional technique.
Figure 15:
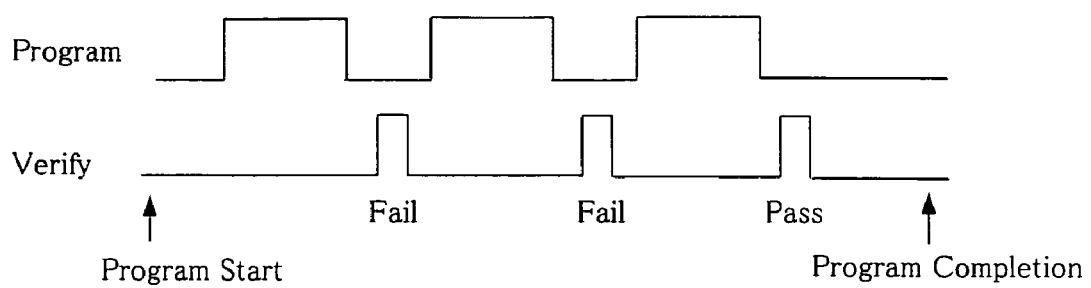
FIG. 15 is a timing chart for explaining the conventional technique.

As another embodiment of the erasing method, instead of controlling whether the erasing voltage should be applied to the selected memory cell by turning the transistor ON or OFF, it is considered to control depending upon whether the voltage should be supplied from an output of the booster circuit as shown in FIG. 13. Among the plurality of memory cells comprising the variable resistive elements, the selected memory cell Rm is connected to the source of TN2 and the input terminal of the sense amplifier circuit SA through the node W2. The reference resistance Rref1 whose resistance is not varied by current or voltage is connected to the source of TN1 and the input terminal of the sense amplifier circuit SA through the node W1. Drains of TN1 and TN2 comprising N type MOSFETs are connected to the output Vout from the booster circuit, and gates thereof receive the erasing enable signal ERSEN, and a signal which is converted into voltage sufficiently higher than the set-up voltage Vout is applied to the gates. The actuation signal ENB of the booster circuit is output from the sense amplifier circuit.

When the selected memory cell Rm is to be erased, the erasing enable signal ERSEN is brought into high level and then, the booster circuit is actuated, and voltage is applied to the selected memory cell and the reference resistance Rref1. When the node W1 which is resistance partial pressure between TN1 and the reference resistance Rref1 and the node W2 which is resistance partial pressure between TN2 and the selected memory cell Rm reach the same voltage, the booster circuit is stopped, the application of voltage to the memory cell is stopped and thus, the erasing operation is completed.

In any of the above-described embodiments, the memory cells are configured using RRAM elements as the variable resistive elements $R_{11}$ to $R_{ij}$. Alternatively, instead of RRAM elements, it is also possible to use, as the variable resistive elements, MRAM (Magnetic RAM) elements whose resistance values are varied by the direction of magnetization, and OUMs (Ovonic Unified Memory) elements whose resistance values are varied by crystalline state change due to heat.

As explained above, according to the present invention, since the programming operation and verifying operation of data into the memory cell are carried out simultaneously, it is possible to shorten the time required for programming processing. Since when the electrical resistance reaches a predetermined resistance value, the programming operation can be stopped, it is possible to set the programming operation of data into the memory cell precisely as close as the target value and thus, the multilevel requirements can be satisfied. Since the application of erasing voltage and verifying operation are carried out simultaneously, the erasing operation can be carried out at high speed. When the resistance value reaches a predetermined value, the application of voltage to the memory cell is stopped. Therefore, consumed current can be reduced.

Although the present invention has been described in terms of preferred embodiments, it will be appreciated that various modifications and alternations might be made by those skilled in the art without departing from the sprit and scope of the invention. The invention should therefore be measured in terms of the claims which follow.

What is claimed is:

1. A semiconductor memory device comprising
a memory cell having a variable resistive element whose electrical resistance is varied,
programming means for programming data into said memory cell using the variation of the electrical resistance of said variable resistive element,
programming state detection means for detecting variation in the electrical resistance at the time of programming operation carried out by said programming means, and
programming control means for stopping the programming operation by said programming means when the electrical resistance is varied to a predetermined reference value.

2. The semiconductor memory device according to claim 1 wherein said programming state detection means can detect the variation in the electrical resistance of said memory cell by comparing the electrical resistance of said memory cell with the reference value fixed to a programming reference cell.

3. The semiconductor memory device according to claim 2, wherein said programming reference cell is formed using a fixed resistance.

4. The semiconductor memory device according to claim 3, wherein said fixed resistance is formed of diffused resistor or polysilicon resistor.

5. The semiconductor memory device according to claim 1, wherein said memory cell comprises a selection transistor and a variable resistive element whose electrical resistance is varied by electrical stress and is held even after the electrical stress is released.

6. The semiconductor memory device according to claim 1, wherein said variable resistive element is formed with an oxide of perovskite structure having manganese between electrodes.

7. The semiconductor memory device according to claim 1, further comprising
erasing means for erasing data from said memory cell using variation of said electrical resistance of said variable resistive element,
erasing state detecting means for detecting variation of said electrical resistance at the time of the erasing operation by said erasing means, and
erasing control means for stopping the erasing operation by said erasing means when the electrical resistance is varied to a predetermined second reference value.

8. The semiconductor memory device according to claim 7, wherein
said programming state detection means and said erasing state detecting means are convertible to each other, and
said programming control means and said erasing control means are convertible to each other.

9. The semiconductor memory device according to claim 7, wherein said erasing state detecting means can detect the variation in the electrical resistance of said memory cell by comparing the electrical resistance with the second reference value fixed to an erasing reference cell.

10. The semiconductor memory device according to claim 9, wherein said erasing reference cell is formed using a fixed resistance.

11. The semiconductor memory device according to claim 10, wherein said fixed resistance is formed of diffused resistor or polysilicon resistor.

12. A semiconductor memory device comprising
a memory cell having a variable resistive element whose electrical resistance is varied by electrical stress and is held even after the electrical resistance is released,
programming means for programming data into said memory cell by applying the electrical stress to said variable resistive element to vary the electrical resistance,
programming state detection means for detecting variation of said electrical resistance at the time of programming operation by said programming means, and
programming control means for stopping application of the electrical stress by said programming means when the electrical resistance is varied to a predetermined reference value.

13. The semiconductor memory device according to claim 12, wherein said programming state detection means can detect the variation in the electrical resistance of said memory cell by comparing the electrical resistance with the reference value fixed to a programming reference cell.

14. The semiconductor memory device according to claim 13, wherein said programming reference cell is formed using a fixed resistance.

15. The semiconductor memory device according to claim 14, wherein said fixed resistance is formed of diffused resistor or polysilicon resistor.

16. The semiconductor memory device according to claim 12, wherein said memory cell comprises a selection transistor and a variable resistive element whose electrical resistance is varied by electrical stress and is held even after the electrical stress is released.

17. The semiconductor memory device according to claim 12, wherein said variable resistive element is formed with an oxide of perovskite structure having manganese between electrodes.

18. The semiconductor memory device according to claim 12, further comprising
erasing means for erasing data from said memory cell by applying the electrical stress to said variable resistive element to vary the electrical resistance,
erasing state detecting means for detecting variation of said electrical resistance at the time of erasing operation by said erasing means, and
erasing control means for stopping the application of electrical stress by said erasing means when the electrical resistance is varied to a predetermined second reference value.

19. The semiconductor memory device according to claim 18, wherein
said programming state detection means and said erasing state detecting means are convertible to each other, and
said programming control means and said erasing control means are convertible to each other.

20. The semiconductor memory device according to claim 18, wherein said erasing state detecting means can detect the variation in the electrical resistance of said memory cell by comparing the electrical resistance with the second reference value fixed to an erasing reference cell.

21. The semiconductor memory device according to claim 20, wherein said erasing reference cell is formed using a fixed resistance.

22. The semiconductor memory device according to claim 21, wherein said fixed resistance is formed of diffused resistor or polysilicon resistor.

23. A semiconductor memory device comprising
a memory cell having a variable resistive element whose electrical resistance is varied,
erasing means for erasing data from said memory cell using variation of the electrical resistance of said variable resistive element,
erasing state detecting means for detecting variation of the electrical resistance at the time of erasing operation by said erasing means, and
erasing control means for stopping the erasing operation by said erasing means when the electrical resistance is varied to a predetermined second reference value.

24. The semiconductor memory device according to claim 23, wherein said erasing state detecting means can detect variation of the electrical resistance of said memory cell by comparing the electrical resistance with the second reference value fixed to the erasing reference cell.

25. The semiconductor memory device according to claim 24, wherein said erasing reference cell is formed using a fixed resistance.

26. The semiconductor memory device according to claim 25, wherein said fixed resistance is formed of diffused resistor or polysilicon resistor.

27. The semiconductor memory device according to claim 23, wherein said memory cell comprises a selection transistor and a variable resistive element whose electrical resistance is varied by electrical stress and is held even after the electrical stress is released.

28. The semiconductor memory device according to claim 23, wherein said variable resistive element is formed with an oxide of perovskite structure having manganese between electrodes.

29. A semiconductor memory device comprising
a memory cell having a variable resistive element whose electrical resistance is held even after the electrical resistance is varied by electrical stress and the electrical stress is released,
erasing means for erasing data from said memory cell by applying the electrical stress to said variable resistive element to vary the electrical resistance,
erasing state detecting means for detecting variation of the electrical resistance at the time of erasing operation by said erasing means, and
erasing control means for stopping application of the electrical stress by said erasing means when the electrical resistance is varied to a predetermined second reference value.

30. The semiconductor memory device according to claim 29, wherein said erasing state detecting means can detect variation of the electrical resistance of said memory cell by comparing the electrical resistance with the second reference value fixed to an erasing reference cell.

31. The semiconductor memory device according to claim 30, wherein said erasing reference cell is formed using a fixed resistance.

32. The semiconductor memory device according to claim 31, wherein said fixed resistance is formed of diffused resistor or polysilicon resistor.

33. The semiconductor memory device according to claim 29, wherein said memory cell comprises a selection transistor and a variable resistive element whose electrical resistance is varied by electrical stress and is held even after the electrical stress is released.

34. The semiconductor memory device according to claim 29, wherein said variable resistive element is formed with an oxide of perovskite structure having manganese between electrodes.

35. A programming method into a memory cell, wherein
said memory cell includes a variable resistive element whose electrical resistance is varied,
a programming operation for programming data into said memory cell using variation of the electrical resistance and a detecting operation for detecting variation of the electrical resistance of said memory cell at the time of the programming operation are carried out simultaneously,
the programming operation is carried out until the electrical resistance reaches a predetermined reference value.

36. A programming method into a memory cell, wherein
said memory cell includes a variable resistive element whose electrical resistance is varied by electrical stress and is held even after the electrical stress is released,
a programming operation for programming data into said memory cell by applying the electrical stress to said variable resistive element to vary the electrical resistance and a detecting operation for detecting variation of the electrical resistance of said memory cell at the time of programming operation are carried out simultaneously,
the application of the electrical stress is stopped when the electrical resistance is varied to a predetermined reference value.

37. An erasing method from a memory cell, wherein
said memory cell includes a variable resistive element whose electrical resistance is varied,
an erasing operation for erasing data from said memory cell is carried out using the variation of the electrical resistance,
a detecting operation for detecting the electrical resistance of said memory cell at the time of the erasing operation is carried out simultaneously with said erasing operation,
said erasing operation is carried out until it is detected that the electrical resistance reaches a predetermined reference value.

38. An erasing method from a memory cell, wherein
said memory cell includes a variable resistive element whose electrical resistance is varied by electrical stress and is held even after the electrical stress is released,
an erasing operation for erasing data from said memory cell is carried out by applying the electrical stress to said variable resistive element to vary the electrical resistance,
a detecting operation for detecting variation of the electrical resistance of said memory cell at the time of the erasing operation, said detecting operation and said erasing operation are carried out simultaneously,
the application of the electrical stress is stopped when the electrical resistance is varied to a predetermined second reference value.

* * * * *